(12) United States Patent
Zhang

(10) Patent No.: US 8,593,216 B2
(45) Date of Patent: Nov. 26, 2013

(54) LOOP FILTER WITH NOISE CANCELLATION

(75) Inventor: Gang Zhang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 11/479,513

(22) Filed: Jun. 30, 2006

(65) Prior Publication Data
US 2008/0001657 A1 Jan. 3, 2008

(51) Int. Cl.
*H03K 5/00* (2006.01)

(52) U.S. Cl.
USPC ............... 327/552; 327/558; 327/157

(58) Field of Classification Search
USPC .......... 327/551–559, 147–161, 336–337
See application file for complete search history.

(56) References Cited

U.S. PATENT DOCUMENTS

| | | | |
|---|---|---|---|
| 6,429,734 B1 * | 8/2002 | Wang et al. | 327/558 |
| 6,963,232 B2 * | 11/2005 | Frans et al. | 327/156 |
| 7,078,948 B2 * | 7/2006 | Dosho | 327/157 |
| 7,161,436 B2 | 1/2007 | Hsu | |
| 2004/0212440 A1 | 10/2004 | Dosho | |
| 2005/0134391 A1 | 6/2005 | Kimura et al. | |
| 2005/0195301 A1 | 9/2005 | Horiuchi | |
| 2005/0280453 A1 | 12/2005 | Hsieh | |

FOREIGN PATENT DOCUMENTS

| | | |
|---|---|---|
| CN | 1476161 A | 2/2004 |
| JP | 51078969 A | 7/1976 |
| JP | 52010051 A | 1/1977 |
| JP | 55098049 U | 7/1980 |
| JP | 1246912 A | 10/1989 |
| JP | 2244821 A | 9/1990 |
| JP | 10075134 A | 3/1998 |
| JP | 10084250 A | 3/1998 |
| JP | 11112337 A | 4/1999 |
| JP | 2000049569 A | 2/2000 |
| JP | 2001111358 A | 4/2001 |
| JP | 2004328456 A | 11/2004 |
| JP | 2005184771 A | 7/2005 |
| JP | 2005252438 A | 9/2005 |
| KR | 19990009178 | 2/1999 |

OTHER PUBLICATIONS

Koo et al., "A fully integrated CMOS frequency Synthesizer with Charge-Averaging Charge Pump and Dual-Path Loop Filter for PCS- and Cellular-CDMA Wireless System", IEEE Journal of Solid-State Circuits, vol. 37, No. 5 May 2002.

(Continued)

*Primary Examiner* — Dinh T. Le

(74) *Attorney, Agent, or Firm* — Ramin Mobarhan

(57) ABSTRACT

A loop filter with noise cancellation includes first and second signal paths, an operational amplifier (op-amp), and a noise cancellation path. The first signal path provides a first transfer function (e.g., a lowpass response) for a first signal. The second signal path provides a second transfer function (e.g., an integration response) for a second signal. The second signal is a scaled version of, and smaller than, the first signal by a factor of alpha, where alpha is greater than one. A capacitor in the second signal path may be scaled smaller by a factor of alpha. The op-amp couples to the first and second signal paths and facilitates summing of signals from the first and second signal paths to generate a control signal having op-amp noise. The noise cancellation path couples to the op-amp and provides a noise cancellation signal used to cancel the op-amp noise in the control signal.

17 Claims, 10 Drawing Sheets

(56) References Cited

OTHER PUBLICATIONS

International Search Report—PCT/US07/071407—International Search Authority—European Patent Office—Nov. 12, 2007.
Michio Okamura, "Design for OP Amplifier," standard edition, Japan, CQ Publishing Co., Ltd., Sep. 30, 1990, pp. 67-70.
Thesis of Fractional-N PLL Frequency Synthesizer Design, The Institute of Electronics Engineers of Korea, Seon-Chul Kim, et al., vol. 42, No. 7, p. 473-478, Jul. 2005.
Written Opinion—PCT/US2007/071407, International Search Authority, European Patent Office, Nov. 12, 2007.

* cited by examiner

LOOP FILTER WITH NOISE CANCELLATION

BACKGROUND

I. Field

The present disclosure relates generally to electronics circuits, and more specifically to a loop filter suitable for use in a phase-locked loop.

II. Background

Phase-locked loops (PLLs) are commonly used in many electronics circuits and are particularly important in communication circuits. For example, digital systems use clock signals to trigger synchronous circuits, e.g., flip-flops. Transmitter and receiver systems use local oscillator (LO) signals for frequency upconversion and downconversion, respectively. Wireless devices (e.g., cellular phones) in wireless communication systems typically use clock signals for digital circuitry and LO signals for transmitter and receiver circuitry. Clock and LO signals are often generated with voltage-controlled oscillators (VCOs) operating within PLLs.

A PLL typically includes a VCO, a loop filter, and other circuit blocks. The loop filter receives and filters a phase error signal and generates a control signal for the VCO. The loop filter may be implemented with discrete circuit components that are external to an integrated circuit (IC). To reduce cost and possibly improve reliability, it is desirable to implement the loop filter on the IC. However, the loop filter typically has a large capacitor that would occupy a large area of the IC. Various schemes may be used to reduce the size of the capacitor. Unfortunately, many of these schemes introduce significant amount of noise to the PLL. The noise may degrade performance and may even cause the VCO/PLL to fail specifications.

There is therefore a need in the art for a loop filter suitable for integration on an IC and having good performance.

SUMMARY

An innovative loop filter with noise cancellation is described herein. In an embodiment, the loop filter comprises first and second signal paths, an operational amplifier (op-amp), and a noise cancellation path. The first signal path receives a first signal from a first current source and provides a first transfer function (e.g., a lowpass response) for the first signal. The second signal path receives a second signal from a second current source and provides a second transfer function (e.g., an integration response) for the second signal. The second current source provides alpha times less output current than the first current source, where alpha is greater than one. The second signal is a scaled version of the first signal and is smaller than the first signal by a factor of alpha. The first signal path may comprise a resistor and a first capacitor. The second signal path may comprise a second capacitor that is scaled smaller by a factor of alpha due to the second signal being scaled smaller by alpha. The smaller capacitor size makes the loop filter well suited for integration on an IC.

The op-amp couples to the first and second signal paths and facilitates summing of signals from the first and second signal paths to generate a control signal having op-amp noise. The op-amp and the first and second signal paths may be coupled in various manners, as described below. The noise cancellation path couples directly or indirectly to the op-amp and provides a noise cancellation signal that is used to cancel the op-amp noise in the control signal. The control signal and the noise cancellation signal may be applied to an adjustable circuit element, e.g., a varactor. This circuit element may be controlled by the control signal and may have the op-amp noise cancelled by the noise cancellation signal.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
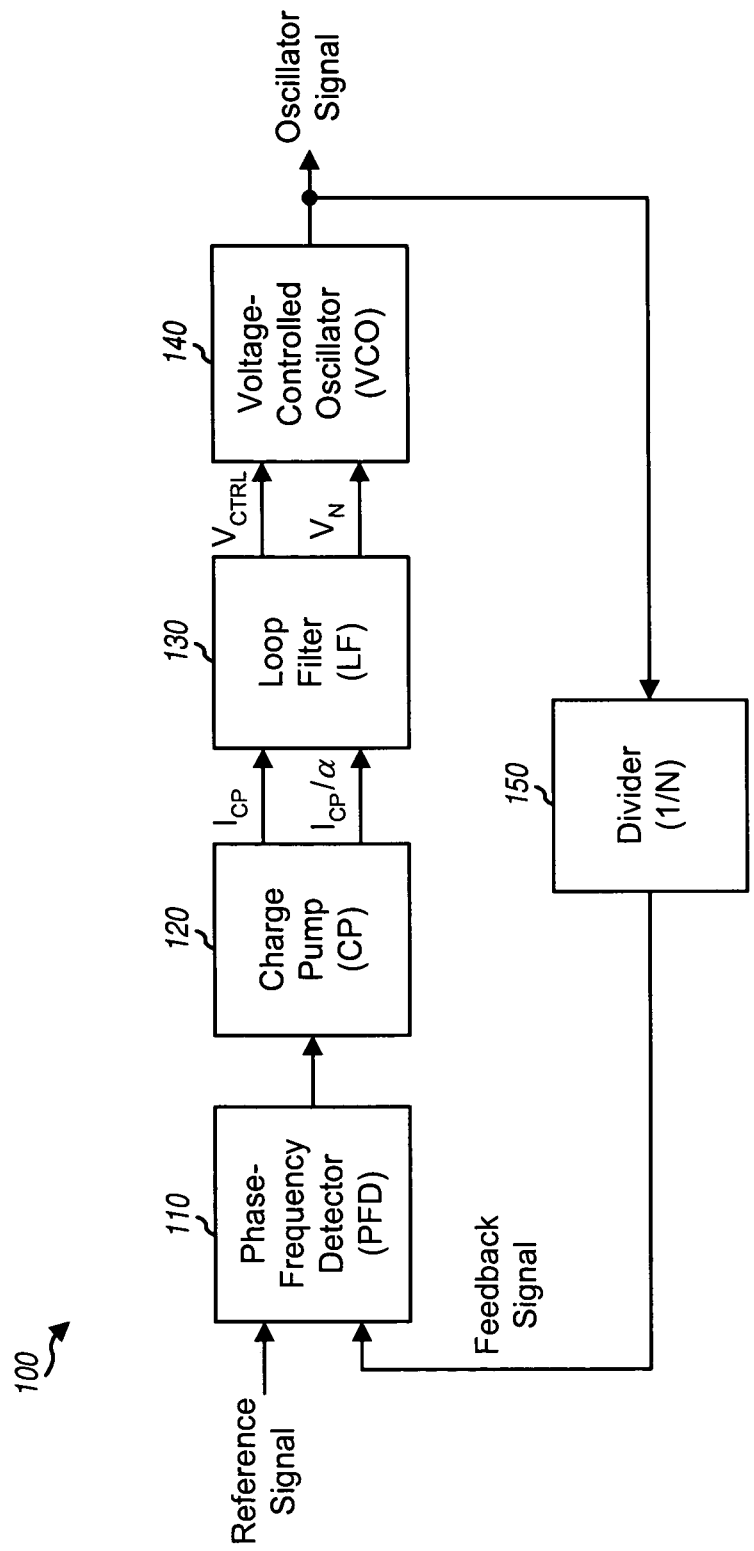
FIG. 1 shows a block diagram of an PLL.

FIG. 1 shows a block diagram of a phase-locked loop (PLL) 100 that includes a phase-frequency detector (PFD) 110, a charge pump (CP) 120, a loop filter (LF) 130, a voltage-controlled oscillator (VCO) 140, and a divider 150. VCO 140 generates an oscillator signal having a frequency that is determined by a control signal $V_{CTRL}$ from loop filter 130. Divider 150 divides the oscillator signal by a factor of N in frequency and provides a feedback signal. In general, N≥1 and may be an integer or non-integer value.

Phase-frequency detector 110 receives a reference signal and the feedback signal, compares the phases of the two signals, and provides a detector signal that indicates the phase difference/error between the two signals. Charge pump 120 generates an error signal $I_{CP}$ that is proportional to the detected phase error. Loop filter 130 filters the error signal and provides the control signal for VCO 140. Loop filter 130 adjusts the control signal such that the phase or frequency of the feedback signal is locked to the phase or frequency of the reference signal.

Loop filter 130 has a frequency response that is typically selected to achieve the desired closed-loop response for PLL 100. For example, the frequency response of loop filter 130 may be selected based on a tradeoff between acquisition and tracking performance and PLL noise performance.

Figure 2A:
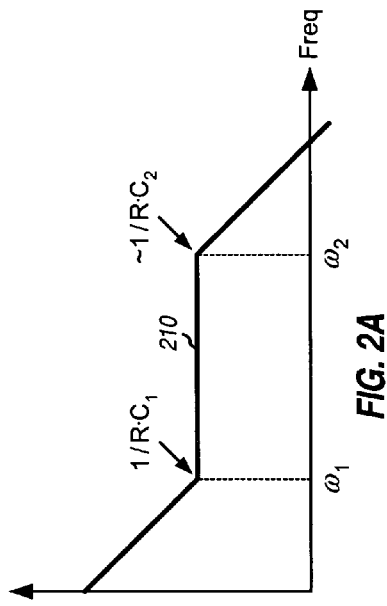
FIG. 2A shows a frequency response of a single-path loop filter.

FIG. 2A shows a plot of a frequency response 210 of loop filter 130. Frequency response 210 includes a first pole at direct current (DC), a zero at frequency $\omega_1$ and a second pole at frequency $\omega_2$. The first pole at DC results in a slope of −20 decibels (dB) per decade of frequency from DC to $\omega_1$. The zero at $\omega_1$ results in a flat frequency response from $\omega_1$ to $\omega_2$. The second pole at $\omega_2$ results in a slope of −20 dB per decade from $\omega_2$ onward.

Figure 3:
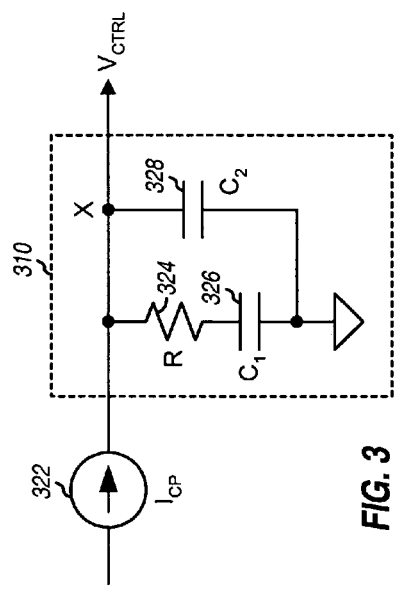
FIG. 3 shows a passive single-path loop filter.

FIG. 3 shows a schematic diagram of a loop filter 310 that can provide frequency response 210 shown in FIG. 2A. Loop filter 310 includes a resistor 324 and capacitors 326 and 328. Resistor 324 and capacitor 326 are coupled in series and between node X and circuit ground. Capacitor 328 is coupled between node X and circuit ground. A current source 322 from charge pump 120 drives node X, which provides the control voltage $V_{CTRL}$ for VCO 140. The desired loop filter frequency response may be obtained by selecting appropriate values for resistor 324, capacitors 326 and 328, and current source 322.

Referring back to FIG. 2A, the location of the zero is determined by resistor 324 and capacitor 326 in FIG. 3, or $\omega_1 = 1/R \cdot C_1$. The location of the second pole is determined by resistor 324 and mostly capacitor 328, or $\omega_2 \approx 1/R \cdot C_2$. Since $\omega_1$ is typically much lower (e.g., an order of magnitude or more lower) than $\omega_2$, capacitor $C_1$ is typically much larger (e.g., an order of magnitude or more) than capacitor $C_2$. If loop filter 310 is implemented on an integrated circuit (IC), then capacitor $C_1$ may occupy a much larger area than capacitor $C_2$. This may make the integration of loop filter 310 on an IC impractical from the perspective of cost.

To reduce the size of capacitor $C_1$, loop filter 310 in FIG. 3 may be decomposed into two signal paths. One signal path may provide an integration response, which may be a frequency response with one pole at DC. The other signal path may provide a lowpass response, which may be a frequency response with one pole at frequency $\omega$. Each signal path may be designed with an appropriately sized capacitor. The outputs of the two signal paths may be summed to obtain a control voltage having the desired frequency response for the loop filter.

Figure 4:
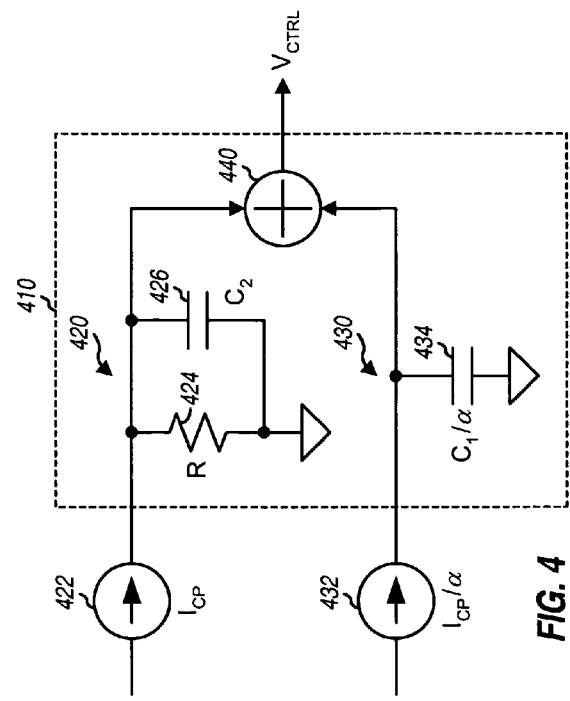
FIG. 4 shows a passive dual-path loop filter.

FIG. 4 shows a schematic diagram of a dual-path loop filter 410 that can provide a frequency response similar to the one shown in FIG. 2A. Loop filter 410 includes a first signal path 420, a second signal path 430, and a summer 440. First signal path 420 includes a resistor 424 and a capacitor 426 that are coupled in parallel and between one input of summer 440 and circuit ground. A current source 422 from charge pump 120 drives resistor 424 and capacitor 426. Second signal path 430 includes a capacitor 434 that is coupled between the other input of summer 440 and circuit ground. A current source 432 from charge pump 120 drives capacitor 434. Summer 440 sums the two inputs and provides the control voltage $V_{CTRL}$ for VCO 140.

First signal path 420 has a transfer function of $H_1(s)$, which may be expressed as:

$$H_1(s) = \frac{1}{C_2} \cdot \frac{1}{s + 1/R \cdot C_2}. \qquad \text{Eq (1)}$$

$H_1(s)$ is a lowpass response having one pole at $\omega_2 = 1/R \cdot C_2$.

Second signal path 430 has a transfer function of $H_2(s)$, which may be expressed as:

$$H_2(s) = \frac{1}{s \cdot C_1}. \qquad \text{Eq (2)}$$

$H_2(s)$ is an integration response having one pole at DC.

Loop filter 410 has an overall transfer function of $H(s)$, which may be expressed as:

$$H(s) = \frac{C_1 + C_2}{C_1 \cdot C_2} \cdot \frac{s + 1/R \cdot (C_1 + C_2)}{s \cdot (s + 1/R \cdot C_2)}. \qquad \text{Eq (3)}$$

Figure 2B:
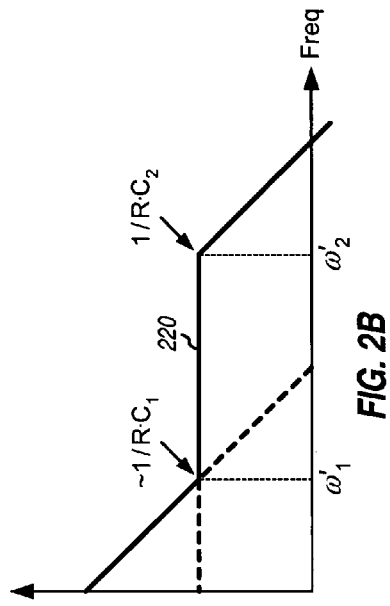
FIG. 2B shows a frequency response of a dual-path loop filter.

FIG. 2B shows a plot of a frequency response 220 of the overall transfer function $H(s)$ for dual-path loop filter 410 in FIG. 4. Frequency response 220 includes a first pole at DC, a zero at frequency $\omega'_1$, and a second pole at frequency $\omega'_2$. Since $C_1$ is much larger than $C_2$, the location of the zero is determined by resistor 424 and mostly capacitor 434, $\omega'_1 \approx 1/R \cdot C_1$. The location of the second pole is determined by resistor 424 and capacitor 426, $\omega'_2 = 1/R \cdot C_2$. The desired loop filter frequency response may be obtained by selecting appropriate values for resistor 424, capacitors 426 and 428, and current sources 422 and 432.

The two signal paths 420 and 430 of loop filter 410 provide flexibility in terms of selecting capacitor values. As shown in FIG. 4, current source 422 may provide a current of $I_{CP}$ whereas current source 432 may provide a current of $I_{CP}/\alpha$, where $\alpha > 1$. This then allows capacitor 434 to be scaled smaller by a factor of $\alpha$. For example, if $\alpha = 10$, then capacitor 434 may have a capacitance of $C_1/10$ and would then be 10 times smaller than capacitor 326 within loop filter 310 in FIG. 3. The smaller capacitor size may allow loop filter 410 to be integrated on an IC.

Dual-path loop filter 410 may be implemented in various manners. Several exemplary designs of loop filter 410 are described below.

Figure 5:
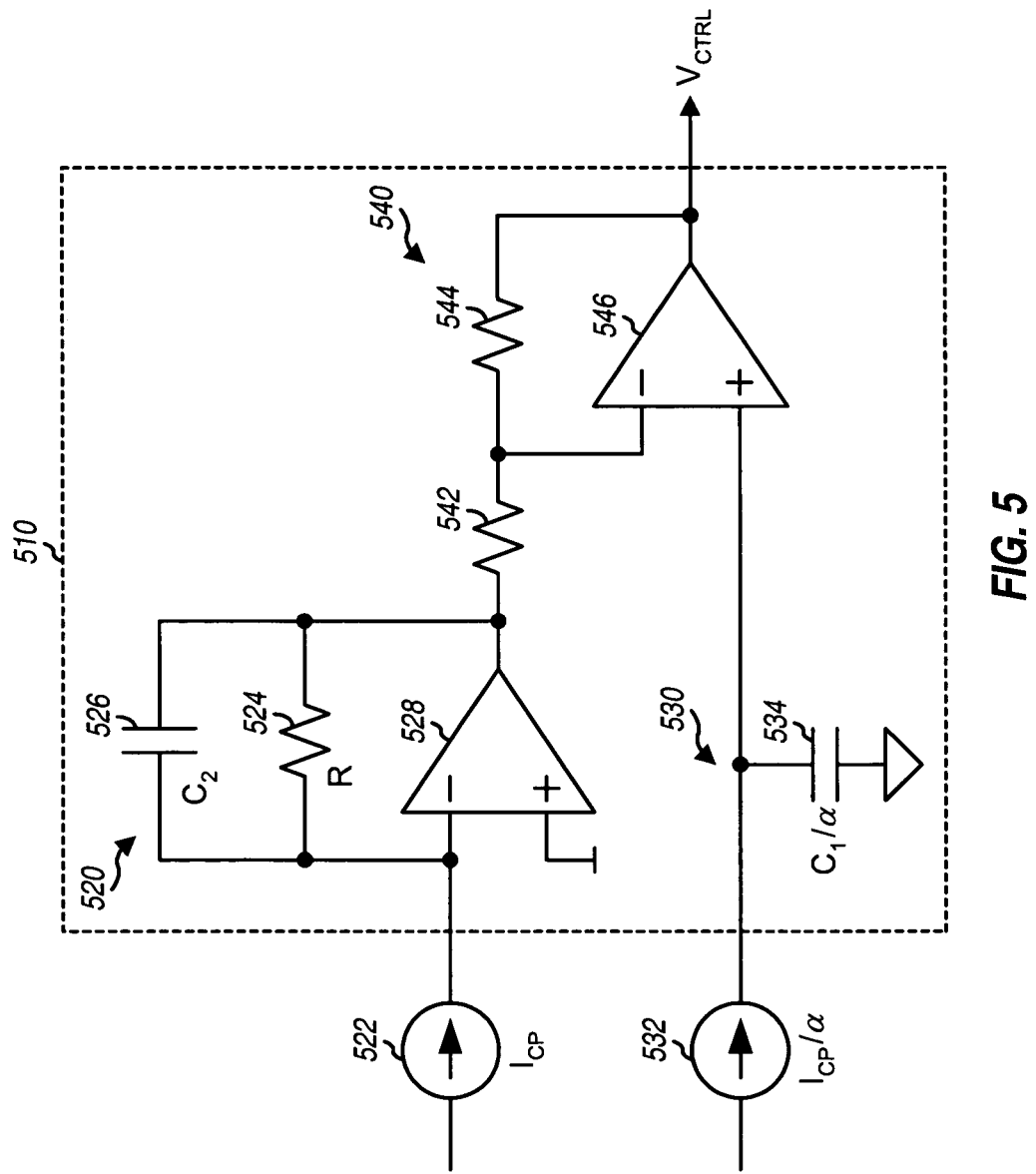
FIG. 5 shows an active dual-path loop filter with two op-amps.

FIG. 5 shows a schematic diagram of a loop filter 510, which is one design for loop filter 410 in FIG. 4. Loop filter 510 includes a first signal path 520, a second signal path 530, and a summing circuit 540. First signal path 520 includes a resistor 524, a capacitor 526, and an op-amp 528. Resistor 524 and capacitor 526 are coupled in parallel and between an inverting input and an output of op-amp 528. A current source 522 from charge pump 120 drives the inverting input of op-amp 528. Second signal path 530 includes a capacitor 534 that is coupled between a non-inverting input of an op-amp 546 and circuit ground. A current source 532 from charge pump 120 drives the non-inverting input of op-amp 546 and capacitor 534. Summing circuit 540 includes resistors 542 and 544 and op-amp 546. Resistor 542 is coupled between the output of op-amp 528 and an inverting input of op-amp 546. Resistor 544 is coupled between the inverting input and the output of op-amp 546. Op-amp 546 provides the control voltage $V_{CTRL}$ for VCO 140.

Loop filter 510 achieves the goals of providing the desired loop filter frequency response and reducing the size of capacitor 534. However, loop filter 510 uses two op-amps to achieve the desired function. These op-amps generate op-amp noise that appears in the control voltage $V_{CTRL}$. Furthermore, a large (e.g., rail-to-rail) voltage swing appears at the non-inverting input of op-amp 546.

Figure 6A:
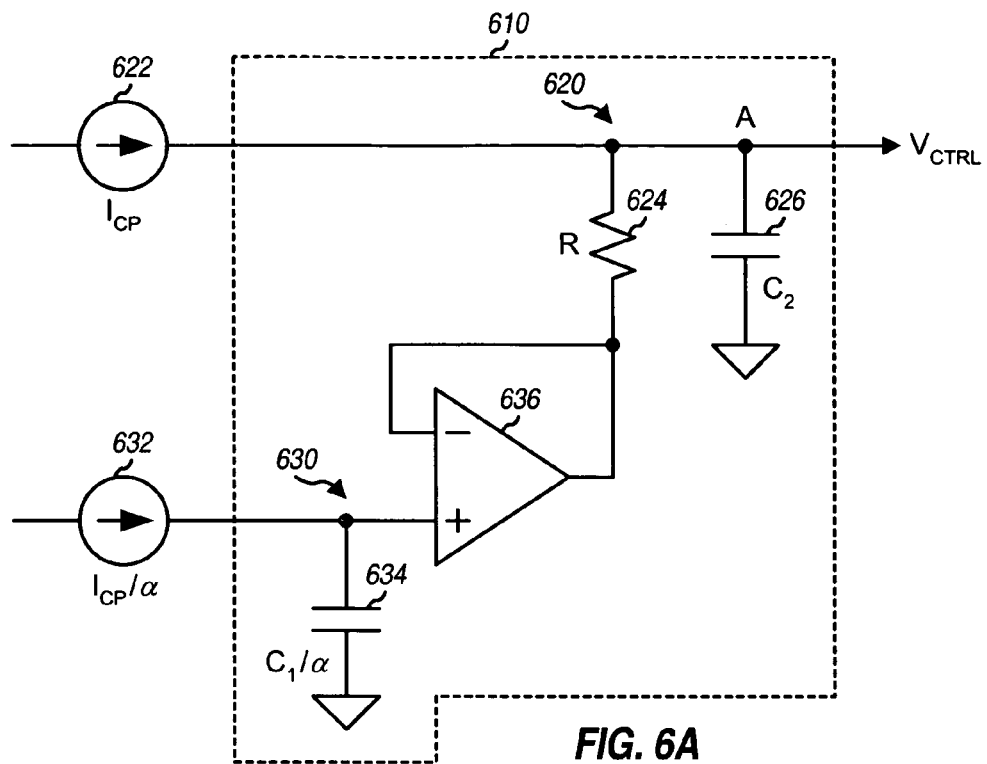
FIGS. 6A and 6B show active dual-path loop filters with single op-amp.

FIG. 6A shows a schematic diagram of a loop filter 610, which is another design for loop filter 410 in FIG. 4. Loop filter 610 includes a first signal path 620, a second signal path 630, and a summing circuit. First signal path 620 includes a resistor 624 and a capacitor 626. Resistor 624 is coupled between the output of an op-amp 636 and node A. Capacitor 626 is coupled between node A and circuit ground. A current source 622 from charge pump 120 drives node A, which provides the control voltage $V_{CTRL}$. Second signal path 630 includes a capacitor 634 that is coupled between a non-inverting input of op-amp 636 and circuit ground. A current source 632 from charge pump 120 drives capacitor 634. Op-amp 636 performs the summing function.

Loop filter 610 achieves the goals noted above using only one op-amp 636. However, this op-amp generates op-amp noise that appears in the control voltage $V_{CTRL}$. Furthermore, a large voltage swing appears at the non-inverting input of op-amp 636.

Figure 6B:
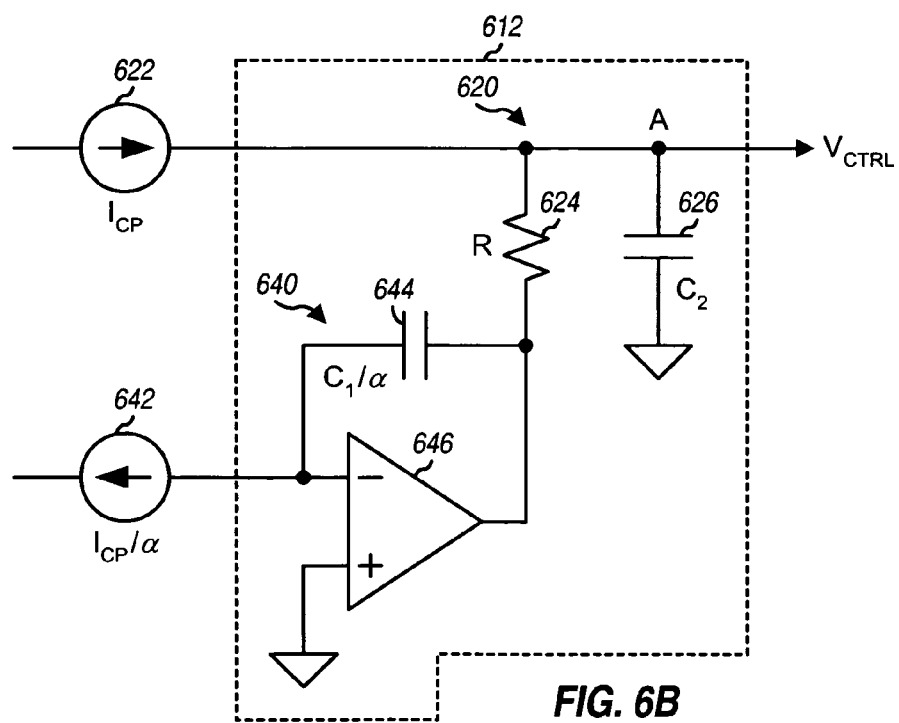

FIG. 6B shows a schematic diagram of a loop filter 612, which is yet another design for loop filter 410 in FIG. 4. Loop filter 612 includes first signal path 620, a second signal path 640, and a summing circuit. Second signal path 640 includes a capacitor 644 that is coupled between an inverting input and an output of an op-amp 646. A current source 642 from charge pump 120 is also coupled to the inverting input of op-amp 646 and drives capacitor 644. Current source 642 is coupled in a direction that is opposite of current source 632 in FIG. 6A. This is because current source 642 is coupled to the inverting input of op-amp 646 in FIG. 6B whereas current source 632 is coupled to the non-inverting input of op-amp 636 in FIG. 6A.

Loop filter 612 achieves the goals noted above using only one op-amp and avoids a large voltage swing at the inverting input of op-amp 646. However, op-amp 646 generates op-amp noise that appears in the control voltage $V_{CTRL}$.

In general, noise from an op-amp in a loop filter may significantly degrade phase noise of a VCO that is controlled by the loop filter. The amount of degradation was measured for one exemplary PLL design. For this PLL design, the integrated phase noise of a VCO was first measured with the PLL using an off-chip passive loop filter, e.g., as shown in FIG. 3. The integrated phase noise of the same VCO was found to degrade by approximately 3 dB when the PLL employs an on-chip active dual-path loop filter with an op-amp, e.g., as shown in FIG. 6A or 6B. This amount of degradation in phase noise may cause the VCO to have smaller phase noise margin or, even worse, to fail phase noise specifications.

In an aspect, an innovative dual-path loop filter with noise cancellation is described. Noise cancellation refers to a process that attempts to cancel, reduce, suppress, or mitigate noise. The innovative loop filter described herein achieves the goals of providing the desired loop filter frequency response and reducing capacitor size without introducing a significant amount of op-amp noise. The innovative loop filter is thus suitable for integration on an IC. Furthermore, good phase noise performance may be achieved for a VCO that is controlled by an on-chip loop filter with noise cancellation.

Figure 7A:
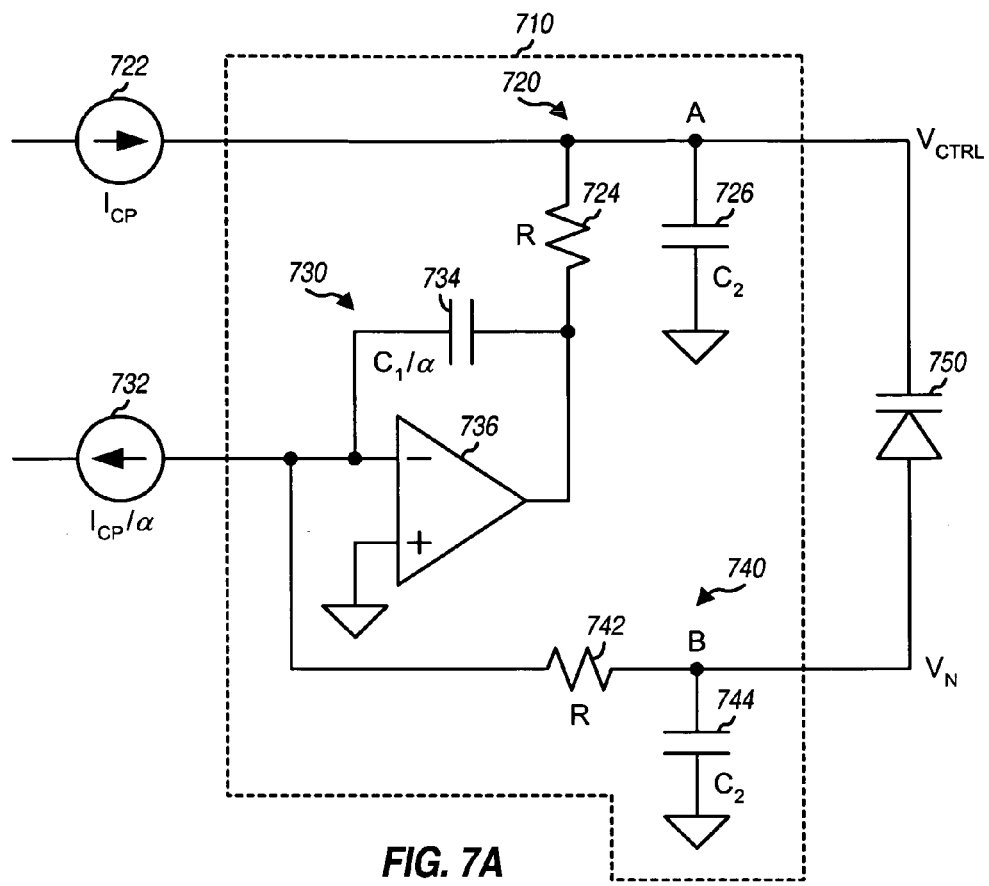
FIGS. 7A through 7D show active dual-path loop filters with noise cancellation.

FIG. 7A shows a schematic diagram of an embodiment of a dual-path loop filter 710 with noise cancellation. Loop filter 710 is a novel design for loop filter 410 in FIG. 4 and may be used for loop filter 130 in FIG. 1. Loop filter 710 includes a first signal path 720, a second signal path 730, a summing circuit, and a noise cancellation path 740. First signal path 720 includes a resistor 724 and a capacitor 726 that are coupled as described above for resistor 624 and capacitor 626, respectively, in FIG. 6A. A current source 722 from charge pump 120 drives the first signal path. Second signal path 720 includes a capacitor 734 that is coupled as described above for capacitor 644 in FIG. 6B. A current source 732 from charge pump 120 drives the second signal path. An op-amp 736 performs the summing function for signals from the two signal paths.

In the embodiment shown in FIG. 7A, noise cancellation path 740 includes a resistor 742 and a capacitor 744. Resistor 742 is coupled between the inverting input of op-amp 736 and node B. Capacitor 744 is coupled between node B and circuit ground. Resistor 742 and capacitor 744 have the same −3 dB bandwidth as resistor 724 and capacitor 726. This results in the op-amp noise at node B having similar characteristics as the op-amp noise at node A (at least at low frequencies).

Node A provides the control voltage $V_{CTRL}$ for VCO 140. Node B provides a noise cancellation voltage $V_N$. A variable capacitor (varactor) 750 is coupled between nodes A and B. The voltage across varactor 750 may be given as: $V_{VAR}=V_{CTRL}-V_N$. Since $V_N$ is at virtual ground in the embodiment shown in FIG. 7A, the voltage across varactor 750 is essentially equal to $V_{CTRL}$.

Loop filter 710 operates as follows. For first signal path 720, since op-amp 736 has low output impedance, current source 722, resistor 724, and capacitor 726 are essentially coupled in the same manner as current source 422, resistor 424, and capacitor 426 in FIG. 4. For second signal path 730, since op-amp 736 also has high input impedance, current source 732 and capacitor 734 are essentially coupled in the same manner as current source 432 and capacitor 434 in FIG. 4. The inverting input of op-amp 736 is at virtual ground because the non-inverting input is coupled to circuit ground. Hence, the voltage swing at the inverting input of op-amp 736 is minimal. Op-amp 736 provides an output voltage that is determined by the current $I_{CP}/\alpha$ from current source 732 and the capacitance $C_1/\alpha$ of capacitor 734. The op-amp output voltage is converted to current via resistor 724 and summed with the current $I_{CP}$ from current source 722 at node A.

For clarity, all op-amp noise is referred to the output of the op-amp in the following description. The noise from op-amp 736 travels via a first op-amp noise path composed of resistor 724 and capacitor 726. The noise from op-amp 736 also travels via a second op-amp noise path composed of capacitor 734, resistor 742, and capacitor 744. The op-amp noise via the second noise path is approximately equal to the op-amp noise via the first noise path, especially at low frequencies. The same op-amp noise is then presented to both ends/terminals of varactor 750. The op-amp noise at one end of varactor 750 essentially cancels the op-amp noise at the other end of the varactor. Varactor 750 would then observe just the desired signal from current sources 722 and 732, assuming that the noise cancellation is effective.

Figure 7B:
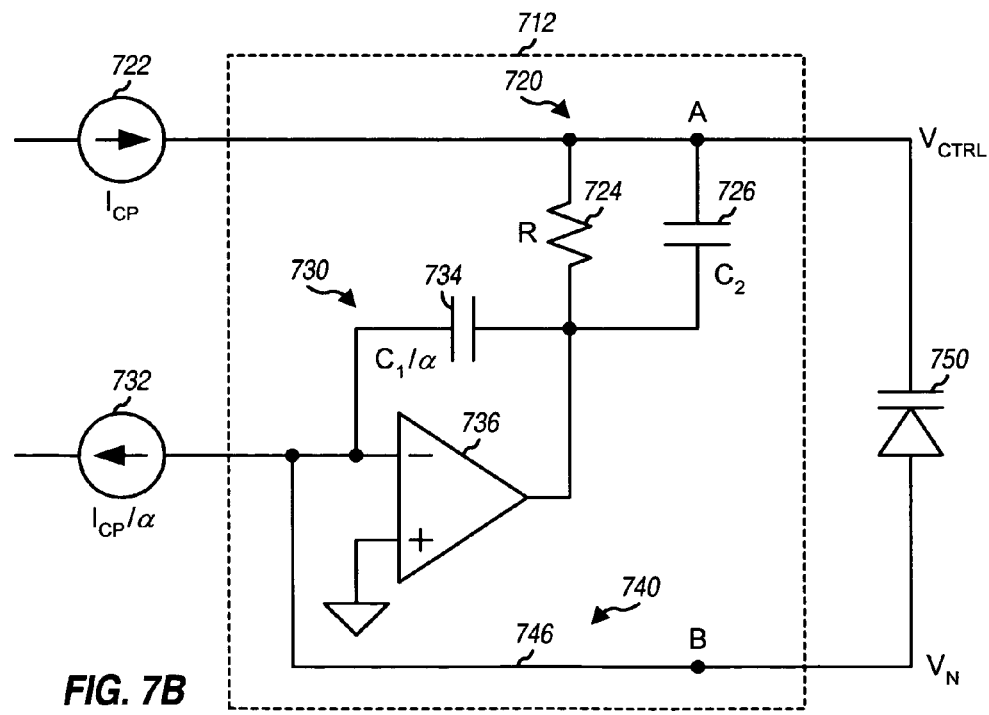

FIG. 7B shows a schematic diagram of an embodiment of a dual-path loop filter 712 with noise cancellation, which is another novel design for loop filter 410 in FIG. 4. Loop filter 712 includes all of the circuit elements in loop filter 710 in FIG. 7A, except for resistor 742 and capacitor 744. In the embodiment shown in FIG. 7B, for first signal path 720, capacitor 726 is coupled between node A and the output of op-amp 736 (instead of between node A and circuit ground). For noise cancellation path 740, the inverting input of op-amp 736 is coupled via a wire line 746 to node B, which provides the noise cancellation voltage $V_N$. The first op-amp noise path is via resistor 724 and capacitor 726. The second op-amp noise path is via capacitor 734 and wire line 746. The op-amp noise via the second noise path is similar to the op-amp noise via the first noise path, especially at low frequencies. Hence, the op-amp noise is essentially canceled at varactor 750, which then observes mostly the desired signal from current sources 722 and 732.

Figure 7C:
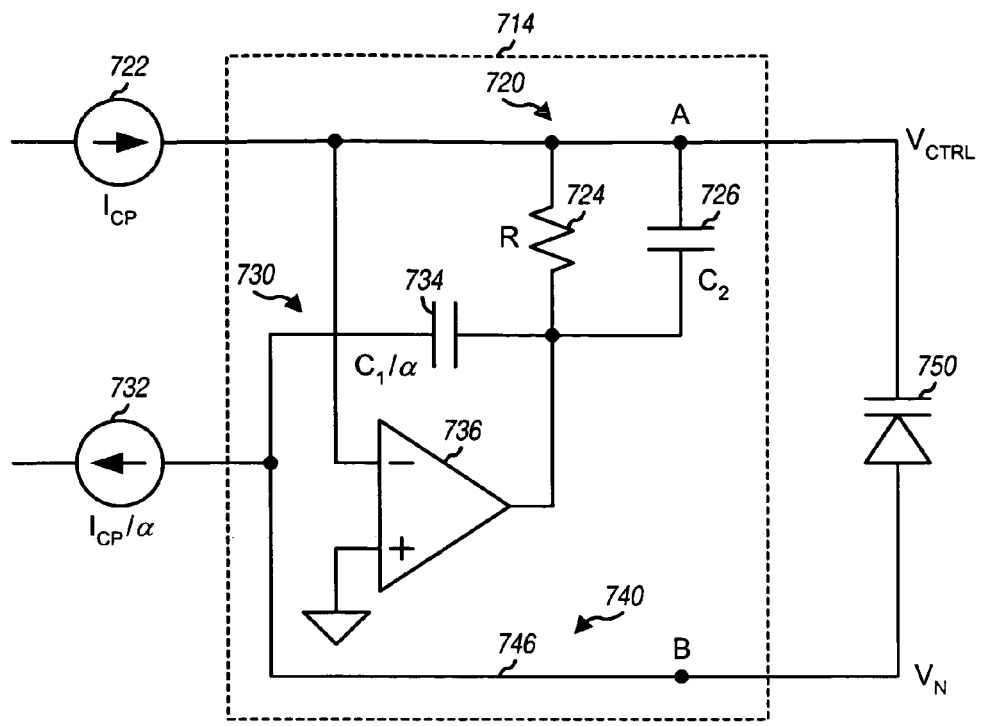

FIG. 7C shows a schematic diagram of an embodiment of a dual-path loop filter 714 with noise cancellation, which is yet another novel design for loop filter 410 in FIG. 4. Loop filter 714 includes all of the circuit elements in loop filter 712 in FIG. 7B. In the embodiment shown in FIG. 7C, for first signal path 720, resistor 724 and capacitor 726 are coupled in parallel and between the inverting input and the output of op-amp 736. Current source 722 is also coupled to the inverting input of op-amp 736 (which is node A) and drives resistor 724 and capacitor 726. For second signal path 730, capacitor 734 is coupled between node B and the output of op-amp 736. Current source 732 is also coupled to node B and drives capacitor 734. For noise cancellation path 740, current source 732 and capacitor 734 are coupled via wire line 746 to node B, which provides the noise cancellation voltage $V_N$.

The first op-amp noise path is via resistor 724 and capacitor 726. The second op-amp noise path is via capacitor 734 and wire line 746. The op-amp noise via the second noise path is similar to the op-amp noise via the first noise path, especially at low frequencies. Hence, the op-amp noise is essentially canceled at varactor 750.

Figure 7D:
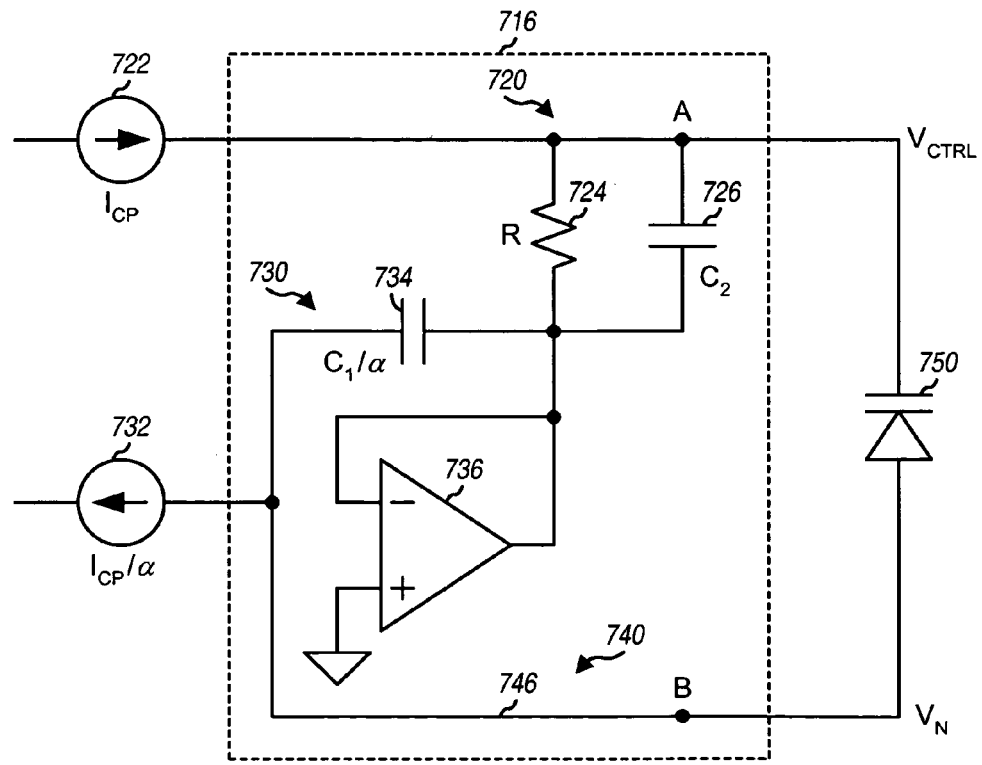

FIG. 7D shows a schematic diagram of an embodiment of a dual-path loop filter 716 with noise cancellation, which is yet another novel design for loop filter 410 in FIG. 4. Loop filter 716 includes all of the circuit elements in loop filter 712 in FIG. 7B. In the embodiment shown in FIG. 7D, for first signal path 720, resistor 724 and capacitor 726 are as described above for FIG. 7B. For second signal path 730, capacitor 734 is coupled between node B and the output of op-amp 736. Current source 732 is also coupled to node B and drives capacitor 734. Op-amp 736 has its inverting input coupled to its output and its non-inverting input coupled to circuit ground. Op-amp 736 thus operates as a unity gain buffer. For noise cancellation path 740, current source 732 and capacitor 734 are coupled via wire line 746 to node B, which provides the noise cancellation voltage $V_N$.

The first op-amp noise path is via resistor 724 and capacitor 726. The second op-amp noise path is via capacitor 734 and wire line 746. The op-amp noise via the second noise path is similar to the op-amp noise via the first noise path, especially at low frequencies. Hence, the op-amp noise is essentially canceled at varactor 750.

FIGS. 7A through 7D show several embodiments of a dual-path loop filter with noise cancellation. The dual-path loop filter with noise cancellation may also be implemented with various other designs, and this is within the scope of the present invention. In general, the loop filter provides a first output signal having a desired signal plus unwanted op-amp noise and a second output signal having the unwanted op-amp noise. A circuit element (e.g., a varactor) that is applied with the first and second output signals would then observe similar op-amp noise at both terminals, and the op-amp noise would essentially be canceled. The effectiveness of the noise cancellation is dependent on how well the op-amp noise in the second output signal matches the op-amp noise in the first output signal. The first and second op-amp noise paths may be designed so that the op-amp noise in the second output signal matches the op-amp noise in the first output signal over a frequency range of interest.

Figure 8:
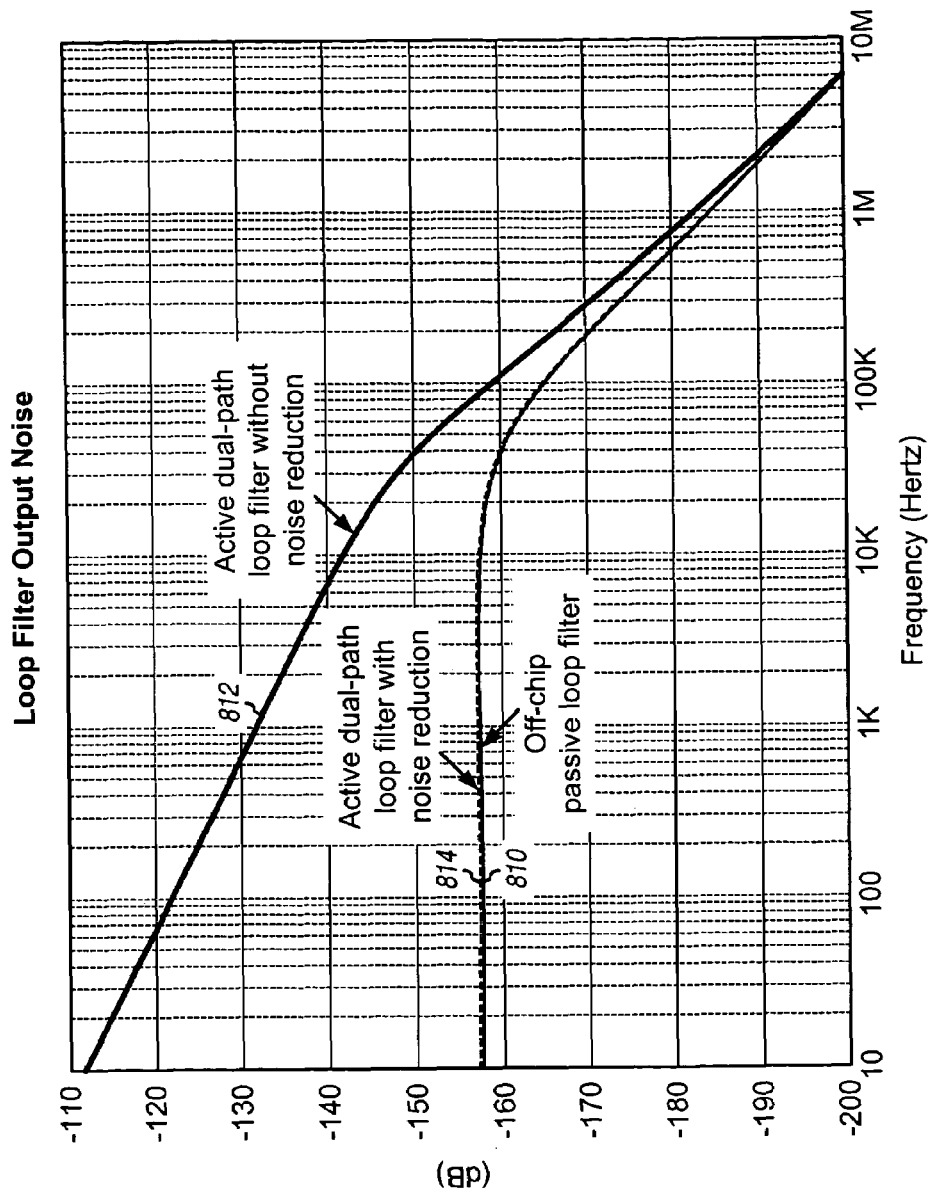
FIG. 8 shows loop filter output noise for three loop filter designs.

FIG. 8 shows plots of output noise for several exemplary loop filter designs. Plot 810 shows an output noise response for an off-chip loop filter with passive components, e.g., as shown in FIG. 3. Plot 812 shows an output noise response for an on-chip active dual-path loop filter without noise cancellation, e.g., as shown in FIG. 6A or 6B. Plot 812 indicates that the op-amp noise adds significantly to the loop filter output noise at low frequencies. Plot 814 shows an output noise response for an on-chip active dual-path loop filter with noise cancellation, e.g., as shown in FIG. 7B. Plot 814 indicates that the op-amp noise is essentially canceled with the noise cancellation signal $V_N$. The noise performance of the on-chip active dual-path loop filter with noise cancellation is comparable to the noise performance of the off-chip passive loop filter.

Figure 9:
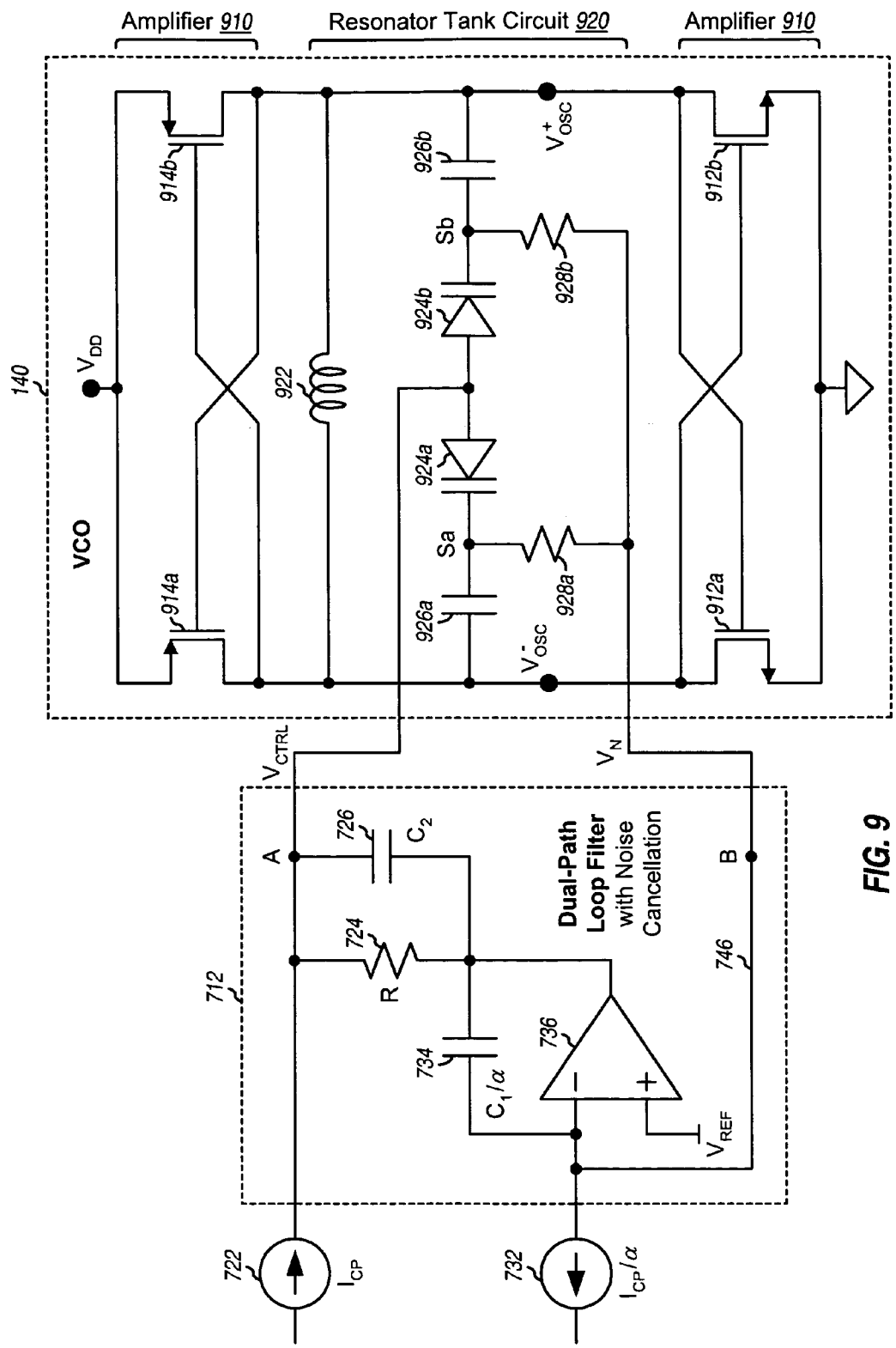
FIG. 9 shows a dual-path loop filter with noise cancellation and a VCO.

FIG. 9 shows a schematic diagram of dual-path loop filter 712 and an embodiment of VCO 140 in FIG. 1. In this embodiment, VCO 140 is implemented with complementary metal-oxide semiconductor (CMOS) and includes an amplifier 910 and a resonator tank circuit 920.

Amplifier 910 is composed of N-channel MOS (N-MOS) transistors 912a and 912b and P-channel MOS (P-MOS) transistors 914a and 914b. Transistors 912a and 914a form a first inverter, and transistors 912b and 914b form a second inverter. Transistor 912a has its source coupled to circuit ground, its drain coupled to the drain of transistor 914a, and its gate coupled to a node $V_{OSC}^+$. Transistor 914a has its source coupled to a power supply, $V_{DD}$, its drain coupled to the drain of transistor 912a, and its gate coupled to node $V_{OSC}^+$. Transistors 912b and 914b are coupled in similar manner as transistors 912a and 914a, respectively. Nodes $V_{OSC}^+$ and $V_{OSC}^-$ represent the input and output, respectively, of the first inverter. Nodes $V_{OSC}^-$ and $V_{OSC}^+$ also represent the input and output, respectively, of the second inverter. The first and second inverters are thus coupled in series and in a closed-loop configuration. Nodes $V_{OSC}^+$ and $V_{OSC}^-$ represent the differential output of VCO 140 and provide the oscillator signal.

Resonator tank circuit 920 is composed of an inductor 922, varactors 924a and 924b, capacitors 926a and 926b, and resistors 928a and 928b. Inductor 922 is coupled between nodes $V_{OSC}^+$ and $V_{OSC}^-$. Varactor 924a has its anode coupled to node A and its cathode coupled to node Sa. Capacitor 926a is coupled between node Sa and node $V_{OSC}^-$. Resistor 928a is coupled between node B and node Sa. Varactor 924b, capacitor 926b, and resistor 928b are coupled in similar manner as varactor 924a, capacitor 926a, and resistor 928a, respectively.

In tank circuit 920, varactors 924a and 924b provide variable capacitance that may be adjusted by the control voltage $V_{CTRL}$ from loop filter 712. The capacitance of varactors 924a and 924b and the inductance of inductor 922 determine the resonant frequency of tank circuit 920, which determines the frequency of the oscillator signal from VCO 140. Capacitors 926a and 926b provide DC blocking to allow nodes Sa and Sb to be biased at the desired voltage. Resistors 928a and 928b provide isolation for nodes Sa and Sb.

Loop filter 712 receives the currents from current sources 722 and 732 in charge pump 120 and generates the control voltage $V_{CTRL}$ as well as the noise cancellation voltage $V_N$ for varactors 924a and 924b within VCO 140. Node A is low impedance and carries the control signal from loop filter 712. Node B is high impedance and has low leakage and essentially no signal swing. The non-inverting input of op-amp 736 may be coupled to a reference voltage $V_{REF}$. The DC voltage at nodes Sa and Sb would then be equal to $V_{REF}$. The bias voltage for varactors 924a and 924b may thus be set by applying an appropriate reference voltage to the non-inverting input of op-amp 736.

FIG. 9 shows an exemplary VCO that may be controlled by a dual-path loop filter with noise cancellation. The dual-path loop filter described herein may also be used with other VCOs as well as other types of oscillators such as, e.g., current controlled oscillators (ICOs), voltage controlled crystal oscillators (VCXOs), and so on. The dual-path loop filter described herein may also be used for various types of PLLs such as integer-N PLL (where frequency divider ratio N in FIG. 1 is an integer value) as well as fractional-N PLL (where N is not an integer value). The first and second signal paths may be designed to provide the desired transfer functions. For example, capacitor $C_2$ in the first signal path may be replaced with a higher order lowpass filter to achieve sharper roll-off for a fractional-N PLL.

Figure 10:
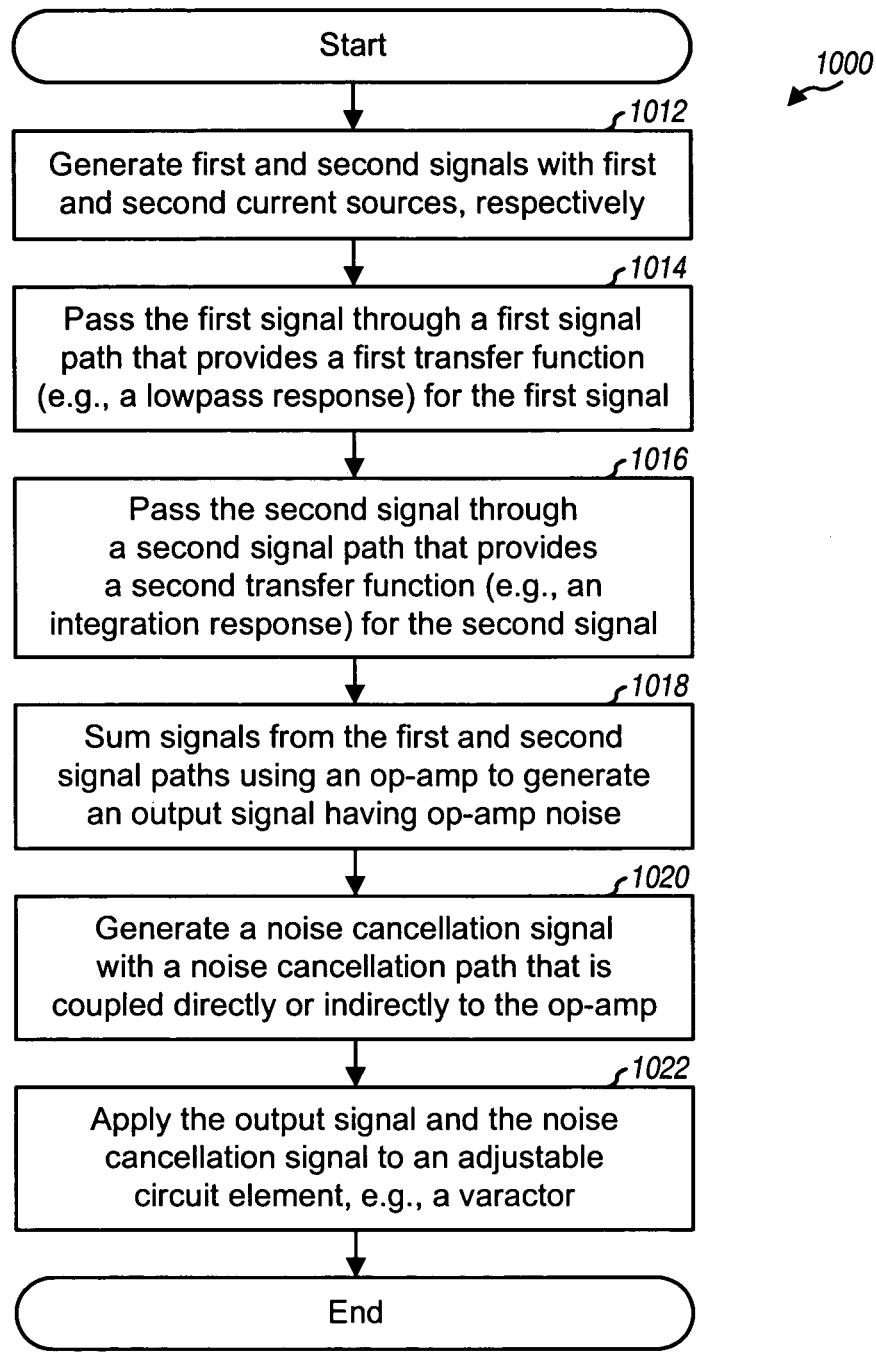
FIG. 10 shows a process for performing loop filtering with noise cancellation.

FIG. 10 shows an embodiment of a process 1000 for performing loop filtering with noise cancellation. First and second signals are generated with first and second current sources, respectively, in a charge pump (block 1012). The second current source provides alpha times less current than the first current source, where alpha is greater than one and may be, e.g., 10 or more. The second signal is a scaled version of the first signal and is smaller than the first signal by a factor of alpha.

The first signal is passed through a first signal path that provides a first transfer function (e.g., a lowpass response) for the first signal (block 1014). The second signal is passed through a second signal path that provides a second transfer function (e.g., an integration response) for the second signal (block 1016). The first signal path may comprise a resistor and a first capacitor. The second signal path may comprise a second capacitor that is scaled smaller by a factor of alpha due to the second signal being scaled smaller by alpha. An op-amp is coupled to the first and second signal paths and is configured to facilitate summing of signals from the first and second signal paths to generate a control signal having op-amp noise (block 1018). The op-amp and the first and second signal paths are part of a loop filter and may be coupled in various manners, e.g., as shown in FIGS. 7A through 7D.

A noise cancellation signal is generated with a noise cancellation path that is coupled directly or indirectly to the op-amp (block 1020). The noise cancellation path may comprise a wire line coupled to the op-amp or the second signal path or may comprise additional circuit elements. The noise cancellation signal is used to cancel the op-amp noise in the control signal. The control signal and the noise cancellation signal are applied to an adjustable circuit element, e.g., a varactor (block 1022).

For clarity, a loop filter with two signal paths and employing noise cancellation has been described above. Noise cancellation may also be used for loop filters with more than two signal paths. For example, a multi-path loop filter may comprise one or more signal paths that filter a control signal used for tracking frequency error in a VCO, another one or more signal paths that filter a sweep signal used for acquisition, yet another one or more signal paths that filter an adjustment signal used to center the frequency of the VCO, and so on.

The loop filter with noise cancellation described herein may be used for various electronics circuits. The use of the loop filter with noise cancellation for a wireless communication device is described below.

Figure 11:
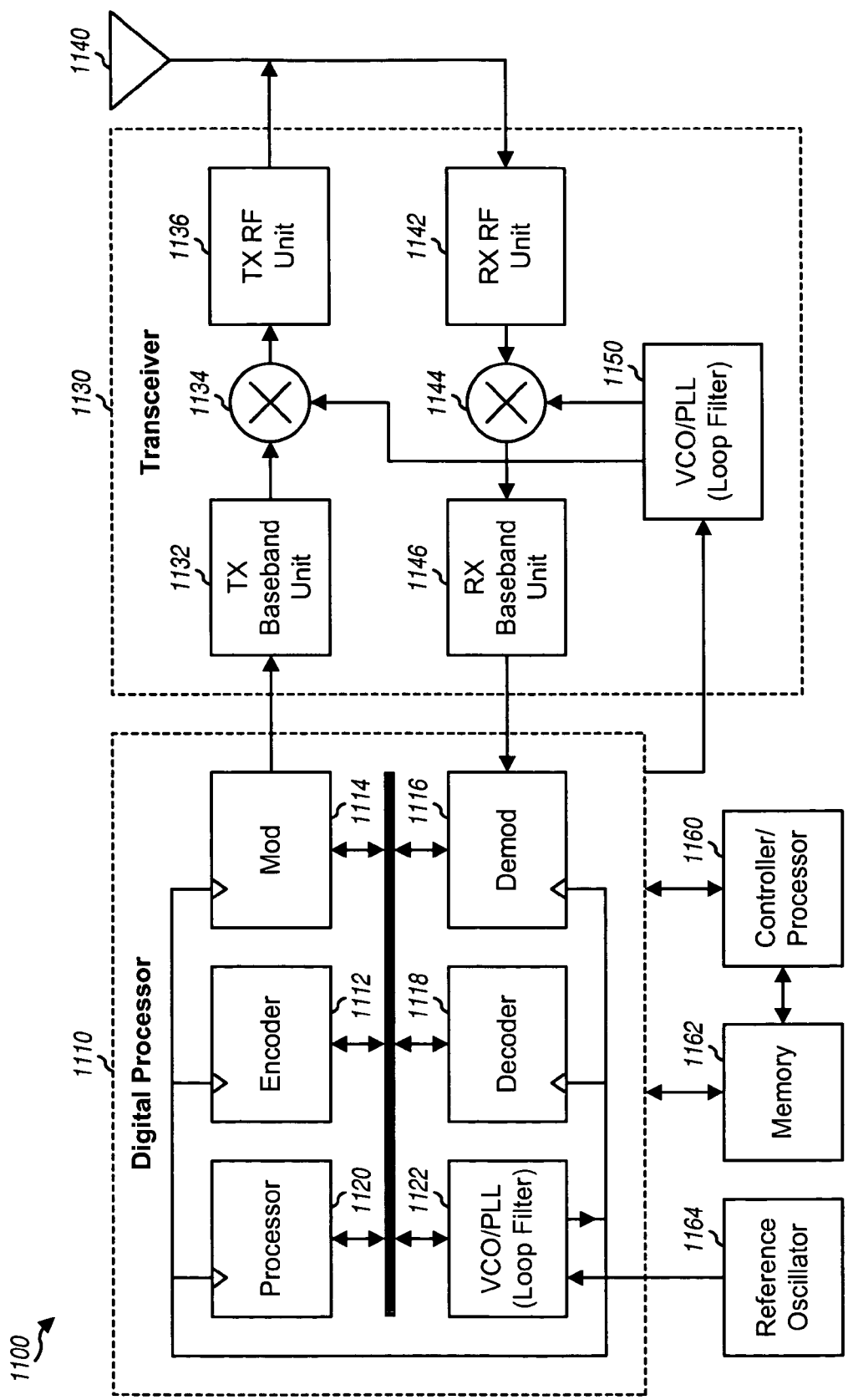
FIG. 11 shows a block diagram of a wireless device.

FIG. 11 shows a block diagram of an embodiment of a wireless device 1100 in a wireless communication system. Wireless device 1100 may be a cellular phone, a terminal, a personal digital assistant (PDA), a handset, or some other device. The wireless communication system may be a Code Division Multiple Access (CDMA) system, a Time Division Multiple Access (TDMA) system, a Frequency Division Multiple Access (FDMA) system, a Global System for Mobile Communications (GSM) system, an Orthogonal FDMA (OFDMA) system, and so on.

Wireless device 1100 includes a digital processor 1110 and a transceiver 1130 that supports bi-directional communication. Digital processor 1110 may be implemented with one or more application specific integrated circuits (ASICs), and transceiver 1130 may be implemented with one or more RF integrated circuits (RFICs).

Within digital processor 1110, an encoder 1112 processes (e.g., formats, encodes, and interleaves) data to be transmitted, and a modulator (Mod) 1114 further processes (e.g., modulates and scrambles) the coded data to generate data chips. Within transceiver 1130, a transmit (TX) baseband unit 1132 performs baseband processing such as digital-to-analog conversion, filtering, amplification, and so on. A mixer 1134 upconverts the baseband signal to RF. A TX RF unit 1136 performs signal conditioning such as filtering and power amplification and generates an RF modulated signal, which is transmitted via an antenna 1140. For data reception, a receive (RX) RF unit 1142 receives an input RF signal from antenna 1140 and performs signal conditioning such as low noise amplification and filtering. A mixer 1144 downconverts the conditioned RF signal from RF to baseband. An RX baseband unit 1146 performs baseband processing such as filtering, amplification, analog-to-digital conversion, and so on. A demodulator (Demod) 1116 processes (e.g., descrambles and demodulates) the input samples from unit 1146 and provides symbol estimates. A decoder 1118 processes (e.g., deinterleaves and decodes) the symbol estimates and provides decoded data. In general, the processing by data processor 1110 and transceiver 1130 is dependent on the design of the wireless system.

A processor 1120 may support various applications such as video, audio, graphics, and so on. A controller/processor 1160 directs the operation of various processing units within wireless device 1100. A memory 1162 stores program codes and data for wireless device 1100.

A VCO/PLL 1122 generates clock signals for the processing units within digital processor 1110. A VCO/PLL 1150 generates a transmit LO signal used by mixer 1134 for frequency upconversion and a receive LO signal used by mixer 1144 for frequency downconversion. VCO/PLL 1122 and VCO/PLL 1150 may each employ a loop filter with noise cancellation to improve noise performance. A reference oscillator 1164 generates a reference signal for VCO/PLL 1122 and/or VCO/PLL 1150.

The loop filter with noise cancellation described herein may be implemented in an analog IC, an RFIC, an ASIC, a digital signal processor (DSP), a digital signal processing device (DSPD), a programmable logic device (PLD), a field programmable gate array (FPGA), a processor, a controller, a micro-controller, a microprocessor, and other electronic units. The loop filter with noise cancellation may be implemented in various IC process technologies such as N-MOS, P-MOS, CMOS, BJT, GaAs, and so on. The loop filter may also be implemented with discrete components.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:
1. An apparatus comprising:
a first signal path including a first transfer function circuit to provide a control signal for a first terminal of a resonator tank circuit of a VCO circuit and configured to receive a first signal and to perform the first transfer function on the first signal;
a second signal path including a second transfer function circuit and configured to receive a second signal and to perform the second transfer function on the second signal, the second signal is a scaled version of the first signal by a factor and the second signal path includes at least one component scaled smaller by the factor;

a summing circuit including a non-unity gain configured operational amplifier (op-amp) coupled to the first and second signal paths and the op-amp configured to sum output signals from the first and second signal paths to generate the control signal having op-amp noise; and a noise cancellation path coupled between the output signal of the second signal path and a second terminal of the resonator tank circuit and configured to provide a noise cancellation signal used to cancel the op-amp noise in the control signal.

2. The apparatus of claim 1, wherein the first transfer function is a lowpass response, and wherein the second transfer function is an integration response.

3. The apparatus of claim 1, wherein the first signal path comprises a resistor and a first capacitor configured to provide a lowpass response for the first signal, and wherein the second signal path comprises a second capacitor configured to provide an integration response for the second signal.

4. The apparatus of claim 3, wherein the second capacitor is coupled between an inverting input and an output of the op-amp.

5. The apparatus of claim 3, wherein the resistor and the first capacitor are coupled in parallel and between the first signal and an output of the op-amp.

6. The apparatus of claim 1, wherein the noise cancellation path comprises a wire line coupled to the op-amp or the second signal path.

7. The apparatus of claim 1, wherein the second signal is a scaled version of the first signal and is smaller than the first signal by a factor of alpha, where alpha is greater than one.

8. The apparatus of claim 7, wherein the second signal path comprises a capacitor that is scaled smaller by a factor of alpha.

9. The apparatus of claim 1, further comprising:
a first current source configured to provide the first signal; and
a second current source configured to provide the second signal, wherein the second current source provides alpha times less current than the first current source, where alpha is greater than one.

10. The apparatus of claim 9, wherein alpha is 10 or more.

11. The apparatus of claim 1, further comprising:
a varactor coupled between the control signal and the noise cancellation signal.

12. An integrated circuit comprising:
a first signal path including a first transfer function circuit to provide a control signal for a first terminal of a resonator tank circuit of a VCO circuit and configured to receive a first signal and to perform the first transfer function on the first signal;
a second signal path including a second transfer function circuit and configured to receive a second signal and to perform the second transfer function on the second signal, the second signal is a scaled version of the first signal by a factor and the second signal path includes at least one component scaled smaller by the factor;
a summing circuit including a non-unity gain configured operational amplifier (op-amp) coupled to the first and second signal paths and the op-amp configured to sum output signals from the first and second signal paths to generate the control signal having op-amp noise; and
a noise cancellation path coupled between the output signal of the second signal path and a second terminal of the resonator tank circuit and configured to provide a noise cancellation signal used to cancel the op-amp noise in the control signal.

13. The integrated circuit of claim 12, further comprising:
a first current source configured to provide the first signal; and
a second current source configured to provide the second signal, wherein the second current source provides alpha times less current than the first current source, where alpha is greater than one.

14. The integrated circuit of claim 13, wherein the second signal path comprises a capacitor used to obtain the second transfer function and scaled smaller by a factor of alpha.

15. A method comprising:
passing a first signal through a first signal path including a first transfer function circuit to provide a control signal for a first terminal of a resonator tank circuit of a VCO circuit and configured to receive the first signal and to perform the first transfer function on the first signal;
passing a second signal through a second signal path including a second transfer function circuit and configured to receive the second signal and to perform the second transfer function on the second signal, the second signal is a scaled version of the first signal by a factor and the second signal path includes at least one component scaled smaller by the factor;
summing output signals from the first and second signal paths with a summing circuit including a non-unity gain configured operational amplifier (op-amp) configured to sum the output signals from the first and second signal paths and to generate the control signal having op-amp noise; and
generating a noise cancellation signal with a noise cancellation path coupled signal path and a second terminal of the resonator tank circuit, the noise cancellation signal being used to cancel the po-amp noise in the control signal.

16. The method of claim 15, further comprising:
generating the first signal with a first current source; and
generating the second signal with a second current source that provides alpha times less current than the first current source, where alpha is greater than one.

17. The method of claim 15, further comprising:
applying the control signal and the noise cancellation signal to an adjustable circuit element.

* * * * *